United States Patent [19]

Kuo

[11] Patent Number: 4,514,028
[45] Date of Patent: Apr. 30, 1985

[54] CRT UPDATED METHOD AND APPARATUS FOR IDENTIFYING INTEGRATED CIRCUIT PINS

[76] Inventor: Wei H. Kuo, 3805 Avenue B, No. 201, Austin, Tex. 78751

[21] Appl. No.: 492,565

[22] Filed: May 9, 1983

[51] Int. Cl.³ .............................................. H01R 3/00
[52] U.S. Cl. ............................... 339/113 R; 33/174 R
[58] Field of Search .................... 339/113 R, 17 CF; D10/71; 33/492, 494, 174 R; 174/112; 40/2 R, 622, 316

[56] References Cited

U.S. PATENT DOCUMENTS

| 563,510 | 7/1896 | Savidge | 33/492 X |
| 2,939,219 | 6/1960 | Georges | 33/492 |
| 3,416,485 | 12/1968 | Phillips | 33/494 X |

FOREIGN PATENT DOCUMENTS 10990 1/1979 Japan ............................ 339/113 R Primary Examiner—Eugene F. Desmond

[57] ABSTRACT

An apparatus for readily identifying the pin number and total number of pins of an integrated circuit having multiple leads or pins arranged in two substantially parallel rows is provided. The apparatus has a rectangular frame with opposite ends of predetermined width and sides having a plurality of notches. The notches are formed so that when at least one of the sides is placed adjacent the pins, each of the pins fits substantially inside one of the notches. Labeling means are placed on at least one of the faces of the apparatus for correlating a predetermined notch with a pin of the integrated circuit.

9 Claims, 3 Drawing Figures

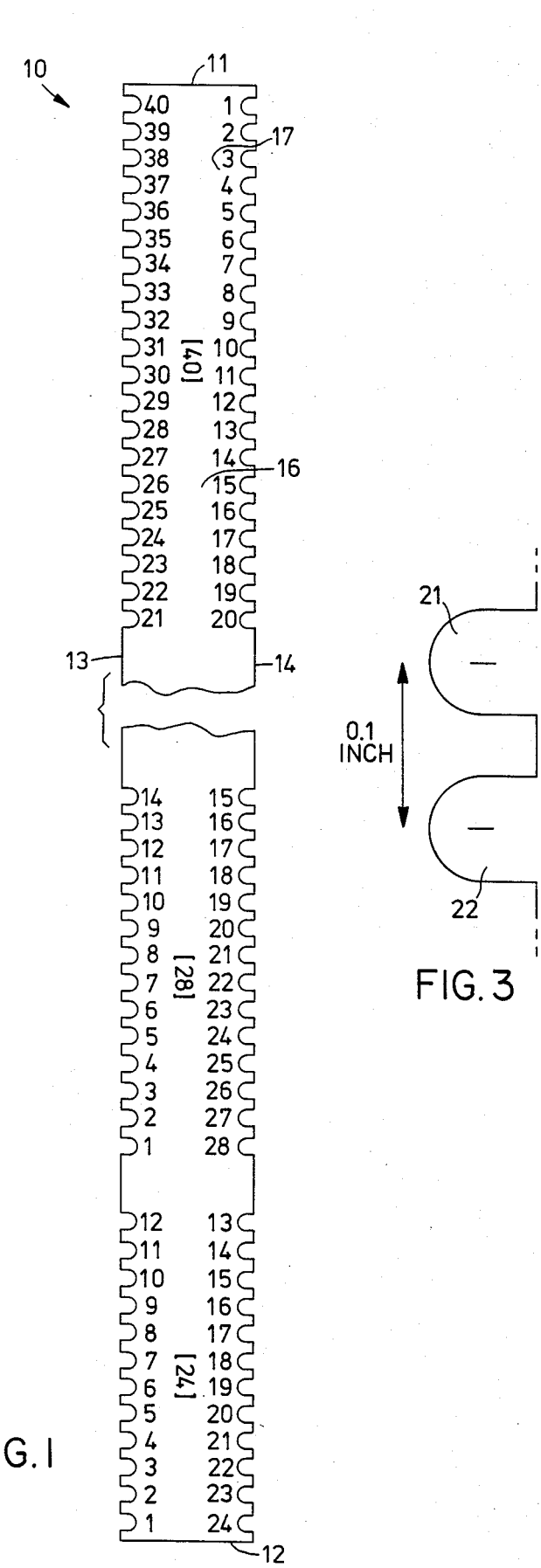
FIG. 1
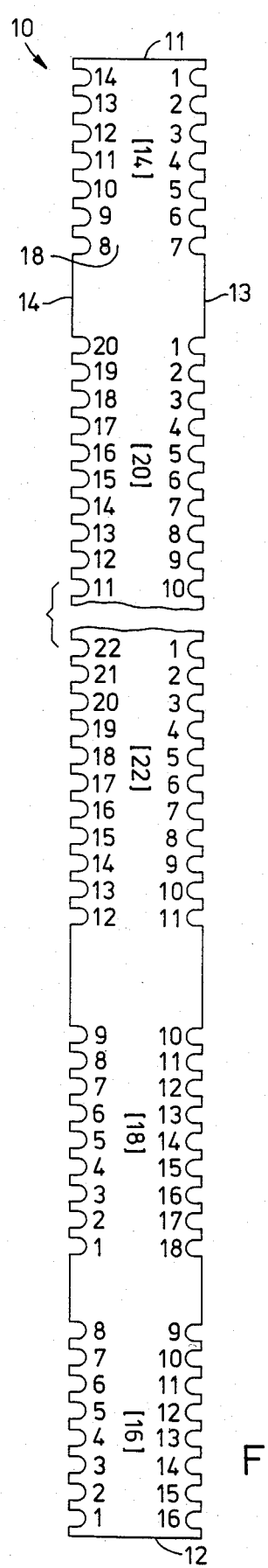
FIG. 2
FIG. 3

CRT UPDATED METHOD AND APPARATUS FOR IDENTIFYING INTEGRATED CIRCUIT PINS

TECHNICAL FIELD

This invention relates generally to integrated circuits and, more particularly, to the identifying of the location of numbered pins of an integrated circuit.

BACKGROUND ART

In order to make an integrated circuit functional or to measure voltages associated with an integrated circuit, the correct pins of the integrated circuit must be located. When an integrated circuit is connected into a circuit, an assembler typically must either solder or wrap wire to predetermined pins of the circuit. This is not only time consuming but is also susceptible to human error since the pin numbers are not readily identifiable and must usually be counted to be identified. Similar problems exist in identifying pins when an integrated circuit is being tested by measuring voltages at predetermined pins. One known method to identify integrated circuit pins is to use plastic panels having a length and width which are substantially the same as an integrated circuit and which have numbered holes. Such plastic panels may be fitted onto integrated circuit socket pins in a manner so that the numbers identify the pins. However, such socket panels are generally permanent or for a single use and are of a specific pin count which requires a user to specifically identify the total number of pins of an integrated circuit and to locate a socket panel with the corresponding number of pin holes.

SUMMARY OF THE INVENTION

Accordingly, an object of the present invention is to provide an improved method and apparatus for identifying integrated circuit pins.

Another object of this invention is to provide an apparatus for identifying integrated circuit pins which can be easily repeatedly used.

Yet another object of this invention is to provide an apparatus for readily identifying the pin location of integrated circuits of various pin counts.

In carrying out the above and other objects there is provided, in one form, an integrated circuit pin identifier for readily identifying the number of pins an integrated circuit has and to readily identify the specific pin number of each pin. A rectangular frame is provided having opposite ends with a width which is less than the distance between two rows of multiple pins of an integrated circuit. The sides of the frame are substantially longer than the width of the frame and have a plurality of notches fromed along at least one-half the entire length. The notches are formed so that when at least one of the sides is placed adjacent the pins, each of the pins fits substantially inside one of the notches. Labeling means located on at least one face of the rectangular frame are used to correlate a predetermined notch with a predetermined number thereby identifying a specific pin number of the integrated circuit.

The above and other objects, features and advantages of the present invention will be more clearly understood from the following detailed description taken in conjunction with the accompanying drawings.

BRIEF DESCRIPTION OF THE DRAWINGS

FIG. 1 is a top plan view of a rectangular frame for identifying the pin count and pin number of an integrated circuit;

FIG. 2 is a bottom plan view of the rectangular frame of FIG. 1 for identifying the pin count and pin number of an integrated circuit;

FIG. 3 is a top sectional view of two adjacent notches of the rectangular frame of FIGS. 1 and 2.

DETAILED DESCRIPTION OF A PREFERRED EMBODIMENT

Shown in FIG. 1 is a top plan view of an integrated circuit pin identifier 10 having a rectangular frame with opposite ends 11 and 12 of predetermined width and sides 13 and 14 of predetermined length. In a preferred form, a plurality of adjacent notches are formed along both sides 13 and 14. Labeling means 17 in the form of predetermined numbers are placed on the top face 16 of pin identifier 10 along both sides 13 and 14 so that a predetermined number is adjacent a predetermined notch. In the preferred form, the labeling means 17 comprise numbers which are arranged in groups of differing quantities with a number representing the arithmetic total of the numbers in each group placed substantially in the middle of each group of numbers of labeling means 17.

Shown in FIG. 2 is a bottom plan view of the integrated circuit pin identifier 10 having ends 11 and 12 and sides 13 and 14. A second labeling means 18 is placed on the bottom face of pin identifier 10. Labeling means 18 comprise numbers which are arranged in groups of differing quantities which are different from the groups comprising labeling means 17 of FIG. 1.

Shown in FIG. 3 is a top sectional view of notches 21 and 22 which are any two adjacent notches located along sides 13 or 14. In a preferred form, notches 21 and 22 are substantially semicircular. However, any form of notch may be used to practise the present invention, including rectangular and triangular notches. In a preferred form, any two adjacent notches have their respective centers separated by approximately 0.1 inch. Further, in a preferred form, the width at the opening of each notch along sides 13 and 14 is 0.060 inch.

In the illustrated form, pin identifier 10 may be of variable length. Labeling means 17 comprise labels for each pin for a 24-, 28- and 40-pin integrated circuit including labels for the total pin size of an integrated circuit. Whereas, labeling means 18 comprise labels for 14-, 16-, 18-, 20- and 22-pin size integrated circuits. The labeling means may be an adhesive label which attaches to the rectangular frame or permanently marked or etched on the frame by other means. Pin identifier 10 may be readily adapted for any number of integrated circuit pins by merely changing either label means 17 or 18. Although in the preferred form, label means are placed on both faces of pin identifier 10, the label means may be attached to only one face if so desired. Since specific numbers for pins are assigned according to industry standard, a single labeling means for any n numbered pin integrated circuit, where n is an integer, is sufficient for all integrated circuits of n pins. The width of ends 11 and 12 in a preferred form is substantially one-half inch wide. In this manner, pin identifier 10 may be placed between two parallel rows of integrated circuit pins to simultaneously identify both the number of all pins of an integrated circuit and the total number of pins of the integrated circuit. However, the invention may also be used by placing pin identifier 10 adjacent an outside edge of only one row of pin of an integrated circuit of unknown pin count. Therefore, the width of ends 11 and 12 may be made to be any dimension to still practise the invention. Further, the thickness of pin identifier 10 may be made variable. In a preferred form, pin identifier 10 is 1/16th of an inch which permits easy handling by a user.

In yet another form of the invention, pin identifier 10 may be used with only one group of numbers on a face and combined with similar pin identifiers. In such a form, the plurality of pin identifiers may be attached together by a connected pin piercing an end of each pin identifier. In this form, the pin identifier may be grouped together and a predetermined one swiveled away from the remaining pin identifiers for temporary use.

By now it should be apparent that an integrated circuit pin locator which eliminates the burden of physically counting integrated circuit pins to locate a specific pin has been provided. The presently disclosed invention speeds up the design and repair process of integrated circuits and decreases the chances of error during a wire-wrap assembly stage of circuits.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. An integrated circuit pin identifier for placement either between multiple pins of an integrated circuit which are arranged substantially in two rows or for placement against the outside edge of a row of pins of the integrated circuit, comprising:
    a rectangular frame having opposite ends with a width less than the distance between the two rows of multiple pins, and having sides substantially longer than the width, the sides having a plurality of notches formed along at least one-half the entire length so that when at least one of the sides is placed adjacent the pins, each of the pins fits substantially inside one of the notches; and
    labeling means placed on at least one face of the rectangular frame to correlate a predetermined notch with a predetermined number, said predetermined number representing the number of the adjacent pin of the integrated circuit.

2. The integrated circuit pin identifier of claim 1 wherein the plurality of notches are formed along substantially the entire length of the rectangular frame.

3. The integrated circuit pin identifier of claim 2 wherein the notches are substantially semicircular.

4. The integrated circuit pin identifier of claim 3 wherein adjacent semicircular notches are spaced apart substantially 0.1 inch measured from center to center of adjacent semicircles.

5. The integrated circuit pin identifier of claim 1 wherein the labeling means are placed on both a top and a bottom face of the rectangular frame and comprise at least three groups of numbers arranged to correlate a predetermined notch with a predetermined number representing a specific pin of the integrated circuit, each of said groups of numbers being further labeled to identify a highest number in each group of numbers, thereby providing the total pin size.

6. A method for readily identifying pin numbers of an integrated circuit, comprising the steps of:
    providing a rectangular frame having opposite ends of predetermined width and sides substantially longer than the width having a plurality of notches formed along at least one-half the entire length;
    providing labeling means on at least one face of the rectangular frame to correlate a predetermined notch with a predetermined number;
    selectively placing at least one side of the rectangular frame against a row of pins of an integrated circuit;
    correlating at least one of the predetermined numbers which are each associated with a predetermined notch to an adjacent pin of the integrated circuit; and
    removing the frame from the integrated circuit.

7. The method of claim 6 further including the step of:
    providing second labeling means on at least the face of the rectangular frame which contains the first labeling means for identifying the total number of pins of the adjacent integrated circuit.

8. An integrated circuit pin identifier for placement against at least one row of pins of an integrated circuit, comprising:
    a rectangular frame having opposite ends with a predetermined width, and having sides substantially longer than the width, the sides having a plurality of notches formed along substantially the entire length so that when either side is placed adjacent the pins, each of the pins fits substantially inside one of the notches; and
    labeling means placed on both a top face and a bottom face of the frame to correlate a predetermined notch with a predetermined number, wherein the predetermined number represents the number of the adjacent pin of the integrated circuit.

9. The integrated circuit pin identifier of claim 8 wherein said labeling means further includes means for identifying the total number of pins of the adjacent integrated circuit.

* * * * *